(12) United States Patent
Maruyama

(10) Patent No.: US 6,377,494 B1
(45) Date of Patent: Apr. 23, 2002

(54) SEMICONDUCTOR DEVICE AND ELECTRONIC APPARATUS

(75) Inventor: Akira Maruyama, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/610,894

(22) Filed: Jul. 6, 2000

(30) Foreign Application Priority Data

Jul. 7, 1999 (JP) .......................................... 11-193139

(51) Int. Cl.$^7$ ................................................ G11C 7/00
(52) U.S. Cl. .................... 365/189.09; 365/145; 365/149
(58) Field of Search ........................... 365/189.09, 145, 365/149, 129, 189.01

(56) References Cited

U.S. PATENT DOCUMENTS 5,608,667 A * 3/1997 Osawa ........................ 65/145
5,774,392 A * 6/1998 Kraus et al. ................. 365/145
6,058,040 A * 5/2000 Tada ........................... 365/145
6,288,961 B1 * 9/2001 Tanaka et al. ............... 365/210

* cited by examiner

Primary Examiner—Hoai V. Ho
(74) Attorney, Agent, or Firm—Hogan & Hartson, L.L.P.

(57) ABSTRACT

A semiconductor device has a cell-plate-potential-switching circuit that comprises a switch transistor nSTr (a n-type MOS transistor) and a switch transistor pSTr (a p-type MOS transistor). One source/drain of each of the switch transistors nSTr and pSTr is connected to the corresponding each of cell plates CP. Half of the power supply potential, ($\frac{1}{2}$)Vcc, is applied to the other source/drain of each of the switch transistors nSTr. Potential ($\frac{1}{2}$)Vcc is therefore applied to the cell plates CP of the memory cells Mc, which is selected. A potential ($\frac{1}{2}$)Vcc+αcp is applied to the other source/drain of the switch transistor pSTr. Potential ($\frac{1}{2}$)Vcc+αcp is therefore applied to the cell plates CP of the memory cells MC which is not selected.

20 Claims, 8 Drawing Sheets

SEMICONDUCTOR DEVICE AND ELECTRONIC APPARATUS

BACKGROUND OF THE INVENTION

1. Field of the Invention

The present invention relates to a semiconductor device in which data is stored by charging capacitors, and to an electronic device including the semiconductor device.

2. Description of the Related Art

A DRAM is a memory that requires periodic refreshing, and used for the memory of cellular phones, for example. FIG. 8 is a circuit block diagram showing a part of a conventional DRAM. The configuration and operation of the conventional DRAM is described below briefly using FIG. 8.

A DRAM comprises a memory cell array 5000, sense amplifiers 6000, and read/write circuits 7000. The memory cell array 5000 comprises a plurality of memory cells MC arranged in a row-and-column configuration, a plurality of word lines WL, and a plurality of pairs of bit lines (BL and XBL). In this figure, memory cells MC1 to MC6, word lines WL1 to WL3, and bit lines (BL1 and XBL1) and (BL2 and XBL2) are shown. Each memory cell MC comprises an n-type access transistor nATr and a capacitor C for storing data. Each pair of bit lines (BL and XBL) are connected to the corresponding sense amplifier 6000 and read/write circuit 7000.

The operation of the conventional DRAM is described taking the case of the memory cell MC2. First, the data write operation is described. The word line WL1 is brought to a positive potential to turn on an access transistor nATr2. The bit line BL2 is then brought to a predetermined potential. The predetermined potential is a power supply potential Vcc applied when data "H" is written to the capacitor C2, or a ground potential GND applied when data "L" is written to the capacitor C2. Data "H" or "L" is stored in the capacitor C2 in this manner. The potential of the word line WL1 is then brought to the ground potential GND, whereby the data on the capacitor C2 is preserved.

Next, the data read operation is described. The bit lines BL2 and XBL2 are respectively brought to half the power supply potential (½) Vcc (precharging of the bit lines BL2 and XBL2). The bit lines BL2 and XBL2 are then separated from the power supply and floated. The word line WL1 is thereafter brought to a positive potential to turn on the access transistor nATr2. Consequently, the potential of the bit line BL2 slightly rises (as much as α) from (½) Vcc when data "H" has been written to the capacitor C2. On the other hand, the potential lowers slightly (as much as α) from (½) Vcc when data "L" has been written to the capacitor C2.

The potential of the bit line XBL2, (½) Vcc, and that of the bit line BL2 are compared and amplified by the sense amplifier 6000. When the data of the capacitor C2 is "H", the potential of the bit line BL2 becomes Vcc and that of the bit line XBL2 becomes GND. When the data of the capacitor C2 is "L", on the other hand, the potential of the bit line BL2 becomes GND and that of the bit line XBL2 becomes Vcc. Here data reading from the memory cell MC2 is completed. Although the data stored on the capacitor C2 is destroyed by reading, the data is rewritten to the capacitor C2 with the potential of the bit line BL2 when the data has been read.

In a DRAM, when data "H" is stored in the capacitors, the data "H" changed to data "L" even while power is on if left as is. To prevent this, a DRAM requires refreshing. The refreshing period should be as long as possible in order to reduce the power consumption of a DRAM.

The change from data "H" to "L" described above is accelerated by various causes. This is described using FIG. 9. FIG. 9 is a circuit diagram of part of a conventional DRAM, showing the same configuration as in FIG. 8. It is assumed that data "L" is stored in the capacitor C2 of the memory cell MC2 and data "H" in the capacitor C6 of the memory cell MC6. When data is read from the memory cell MC2, the word line WL1 is at a positive potential, the word lines WL2 and WL3 are at the ground potential GND, the bit line BL2 goes to the ground potential GND, and the bit line XBL2 goes to the power supply potential Vcc. In this case, a very small amount of electric charge Q flows from the capacitor C6 of the memory cell MC6 as shown by the arrow (this is referred to as a subthreshold leak current of transistor), and hence the decay from data "H" to "L" in the capacitor C6 is accelerated.

SUMMARY OF THE INVENTION

An object of the present invention is to provide a semiconductor device of which the power consumption can be reduced and an electronic device using the semiconductor device.

(1) The present invention provides a semiconductor device having a memory cell array comprising a plurality of memory cells and a plurality of word lines and in which the selection and non-selection of the memory cells is controlled by changing a potential of the word lines, wherein:

each of the memory cells comprises an n-type access transistor and a capacitor having a cell plate;

predetermined potential is applied to the cell plate, a potential of the cell plate during a period when the memory cells are selected is a first potential;

a potential of the cell plate during a period when the memory cells are non-selected is a second potential larger than the first potential; and a switching of the potential of the cell plates is controlled by changing a potential of the word lines.

In the present invention, the potential of the cell plates during a non-selected period of the memory cells (second potential) is greater than that of the cell plates during a selected period of the memory cells (first potential). By this configuration, the potential of the nodes (drains) of the n-type access transistors connected to the capacitors is raised because of capacitance coupling by the capacitors during a non-selected period. The rise in the potential of the nodes makes it possible to increase the margin of data "H" decision level in the capacitors. According to the present invention, the refreshing period therefore can be extended and, consequently, the power consumption can be reduced.

(2) In the present invention, the semiconductor device may have a plurality of memory cell groups each of which includes a plurality of the memory cells;

the n-type access transistor included in one of the memory cell groups may be controlled by one of the word lines;

the cell plates at the n-type access transistors included in each of the memory cell groups may be connected together; and the cell plates of one of the memory cell groups may be separated from the other cell plates in a rest of the memory cell groups.

(3) In the present invention, a potential of the cell plate may be switched for each of the memory cell groups.

In this configuration, the potential switching speed of the cell plates can be increased in comparison with the case in which all capacitors of the entire memory cell array are connected together. Moreover, since the capacitance of the cell plates in which the potential is changed is decreased in this embodiment, the power consumption of the semiconductor device can be reduced.

(4) In the present invention, the semiconductor device may have a cell-plate-potential-switching circuit that includes the word lines, a plurality of n-type switch transistors and a plurality of p-type switch transistors, and in one of the word lines, and one of the n-type switch transistors and one of the p-type switch transistors provided to the one of the word lines, the one word line may be connected to a gate electrode of the one n-type switch transistor and a gate electrode of the one p-type switch transistor;

one of sources/drains of the one n-type switch transistor may be connected to the cell plate provided to one of the memory cell groups corresponding to the one word line;

the first potential may be applied to another one of the sources/drains of the ore n-type switch transistor;

one of sources/drains of the one p-type switch transistor may be connected to the cell plate provided to one of the memory cell groups corresponding to the one word line; and the second potential may be applied to another one of the sources/drains of the one p-type witch transistor.

In this configuration, the cell-plate-potential-switching circuit has a simple structure.

(5) In the present invention, the semiconductor device may have a sense amplifier for amplifying data from the capacitor;

a time at which the cell plate is switched from the second potential to the first potential may be delayed until after a time at which the word lines start selection of the memory cells; and wherein the sense amplifier may latch the data from the capacitor before a time at which the cell plate is switched to the fist potential.

According to this configuration, reading error when the data in the capacitors is "H" can be prevented. The reason will be described in the section of "major effects of semiconductor device" in the detailed description of the preferred embodiments.

(6) In the present invention, the semiconductor device may have a word line decoder, and a current supply capability of the n-type switch transistor may be smaller than a current supply capability of the word line decoder.

According to this configuration, the timing for switching the cell plates from the second potential to the first potential can be delayed until after the time at which memory cells start to select the word lines.

(7) In the present invention, a capacitance of each of the word lines may be smaller than a capacitance of the cell plate of one of the memory cell groups corresponding to each of the word lines.

According to this configuration, the timing for switching the cell plates from the second potential to the first potential can be delayed until after the time at which memory cells start to select the word lines.

(8) In the present invention, the cell plate of all of the memory cells may be connected together.

According to this configuration it is possible to simplify the structure of the memory cells.

(9) In the present invention, write and/or rewrite may be performed when the potential of the cell plate is the first potential during the period when the memory cells is selected.

(10) In the present invention, the first potential may be one half a power supply potential Vcc.

(11) In the present invention, the semiconductor device may comprise at least one of DRAM (Dynamic RAM), PSRAM (Pseudo static RAM), and VSRAM (Virtually Static RAM).

(12) The present invention further provides an electronic device using the semiconductor device described above.

DESCRIPTION OF THE PREFERRED EMBODIMENT

A preferred embodiment of the present invention is specifically described below using the drawings. The present invention can be applied to the semiconductor devices in which the data is stored by charging capacitors, such as DRAM (Dynamic RAM), PSRAM (Pseudo-Static RAM), and VSRAM (Virtually static RAM).

Configuration of the Semiconductor Device

Figure 1:
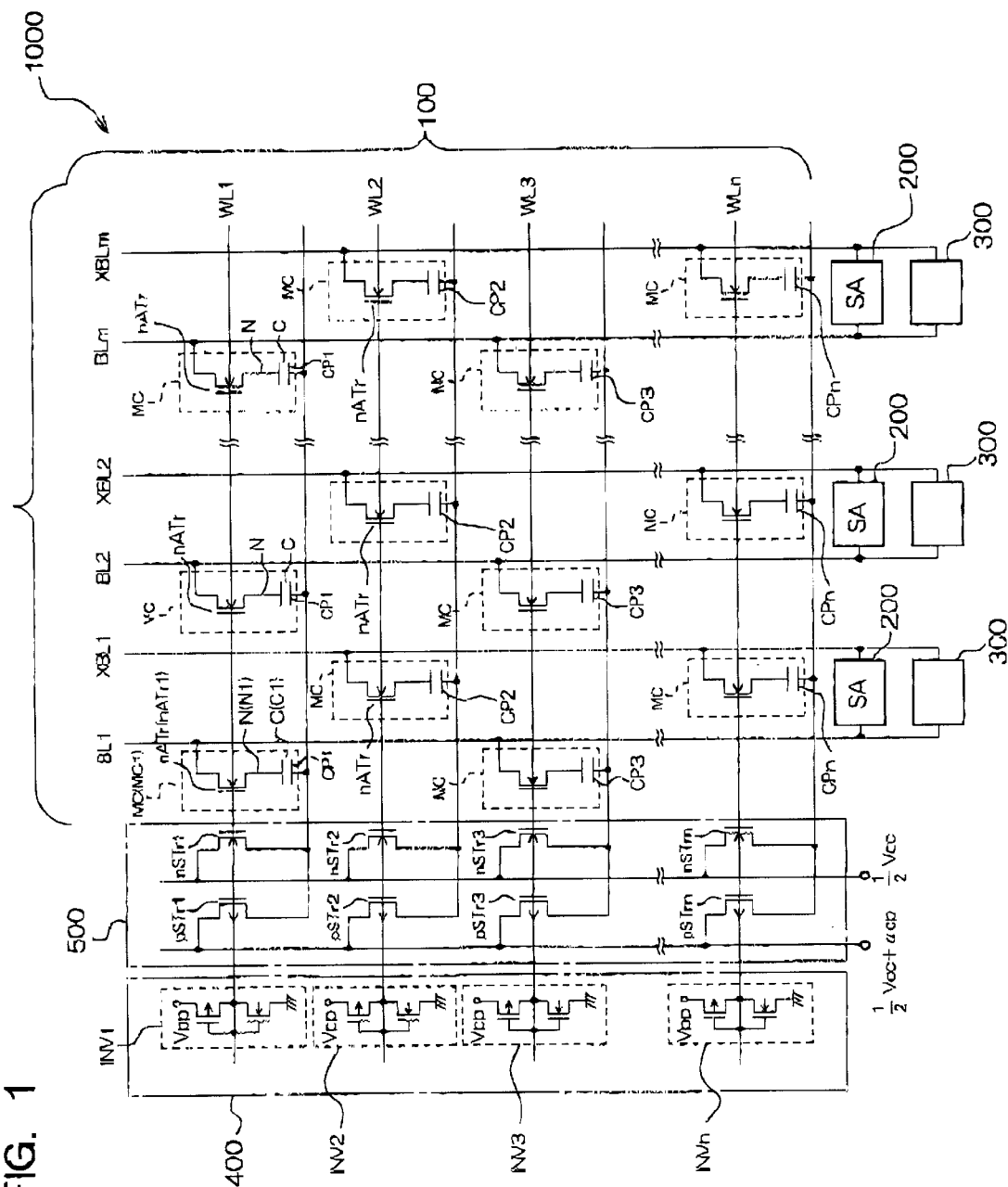
FIG. 1 is a circuit block diagram of the semiconductor device 1000 of an embodiment of the present invention.

The configuration of this embodiment is described first. FIG. 1 is a circuit block diagram of the semiconductor device 1000 of the present embodiment. The semiconductor device 1000 has a memory cell array 100 and a peripheral circuitry. The memory cell array 100 comprises a plurality of word lines WL1 to WLn, a plurality of pairs of bit lines (BL1 and XBL1) to (BLm and XBLm) intersecting the word lines, and m×n memory cells MC arranged so as to correspond to the intersections of the word lines and the bit lines. Each memory cell MC comprises an access transistor nATr that is an n-type MOS transistor and a capacitor C on which data is stored.

The cell plates CP of the capacitors of the access transistors nATr selected by one word line for each row are connected together, by the rows of the corresponding word lines, and separated from the cell plates CP of the capacitors of the access transistors nATr selected by the other word lines. To explain this taking the case of the word line WL1, the cell plates CP1 of the capacitors of the access transistors nATr selected by the word line WL1 are connected together, and separated from the cell plates CP2 to CPn of the capacitors of the access transistors nATr selected by the word lines WL2 to WLn. However, the cell plates of all memory cells MC may be connected together.

Part of the peripheral circuitry of the semiconductor device 1000 is shown in FIG. 1. The peripheral circuitry includes sense amplifiers 200 and read/write circuits 300 connected to the bit line pairs (BL and XBL), a word line decoder 400, and a cell-plate-potential-switching circuit 500 that is a feature of this embodiment.

The word line decoder 400 comprises n number of CMOS inverters INV1 to INVn. The output terminals of the inverters INV1 to INVn are connected to the word lines WL1 to WLn, respectively.

The cell-plate-potential-switching circuit 500 is placed between the memory cell array 100 and the word line decoder 400. The cell-plate-potential-switching circuit 500 comprises n number of switch transistors nSTr1 to nSTrn which are n-type MOS transistors and n number of switch transistors pSTr1 to pSTrn which are p-type MOS transistors.

The gate electrodes of the switch transistors nSTr and those of the switch transistors pSTr are connected in series by the word lines WL. To explain this taking the case of the switch transistor nSTr1, switch transistor pSTr1, and word line WL1, the gate electrode of the switch transistor nSTr1 and that of the switch transistor pSTr1 are connected in series by the word line WL1.

One source/drain of each of the switch transistors nSTr and pSTr is connected to the corresponding each of cell plates CP. To explain this taking the case of the cell plates CP1, one source/drain of the switch transistor nSTr1 and one source/drain of the switch transistor pSTr1 are connected to the cell plates CP1.

Half of the power supply potential, ($\frac{1}{2}$)Vcc, is applied to the other source/drain of each of the switch transistors nSTr. Potential ($\frac{1}{2}$)Vcc is therefore applied to the cell plates CP of the selected memory cells MC. This intends to reduce the electric field in the capacitors. That is, the power supply potential Vcc is applied to the electrodes (nodes) opposite to the cell plates when data "H" is written to the capacitors, and the ground potential GND is applied to the nodes when data "L" is written to the capacitors. When potential ($\frac{1}{2}$)Vcc is being applied to the cell plates at this time, the electric field applied to the dielectric film is ±($\frac{1}{2}$)Vcc divided by the thickness of the dielectric film in both cases of data "H" and "L". This can reduce the electric field to one half in comparison with the cave in which the potential of the cell plates is Vcc or GND.

On the other hand, a potential ($\frac{1}{2}$)Vcc+αcp which is higher than ($\frac{1}{2}$)Vcc by voltage αcp, is applied to the other source/drain of each of the switch transistors pSTr. Potential ($\frac{1}{2}$)Vcc+αcp is therefore applied to the cell plates CP of the non-selected memory cells MC. Consequently, the potential of the nodes N of those memory cells MC rises, and hence the refreshing period can be prolonged. Details are described in the section of major effects of the semiconductor device.

Operation of the Semiconductor Device

Figure 2:
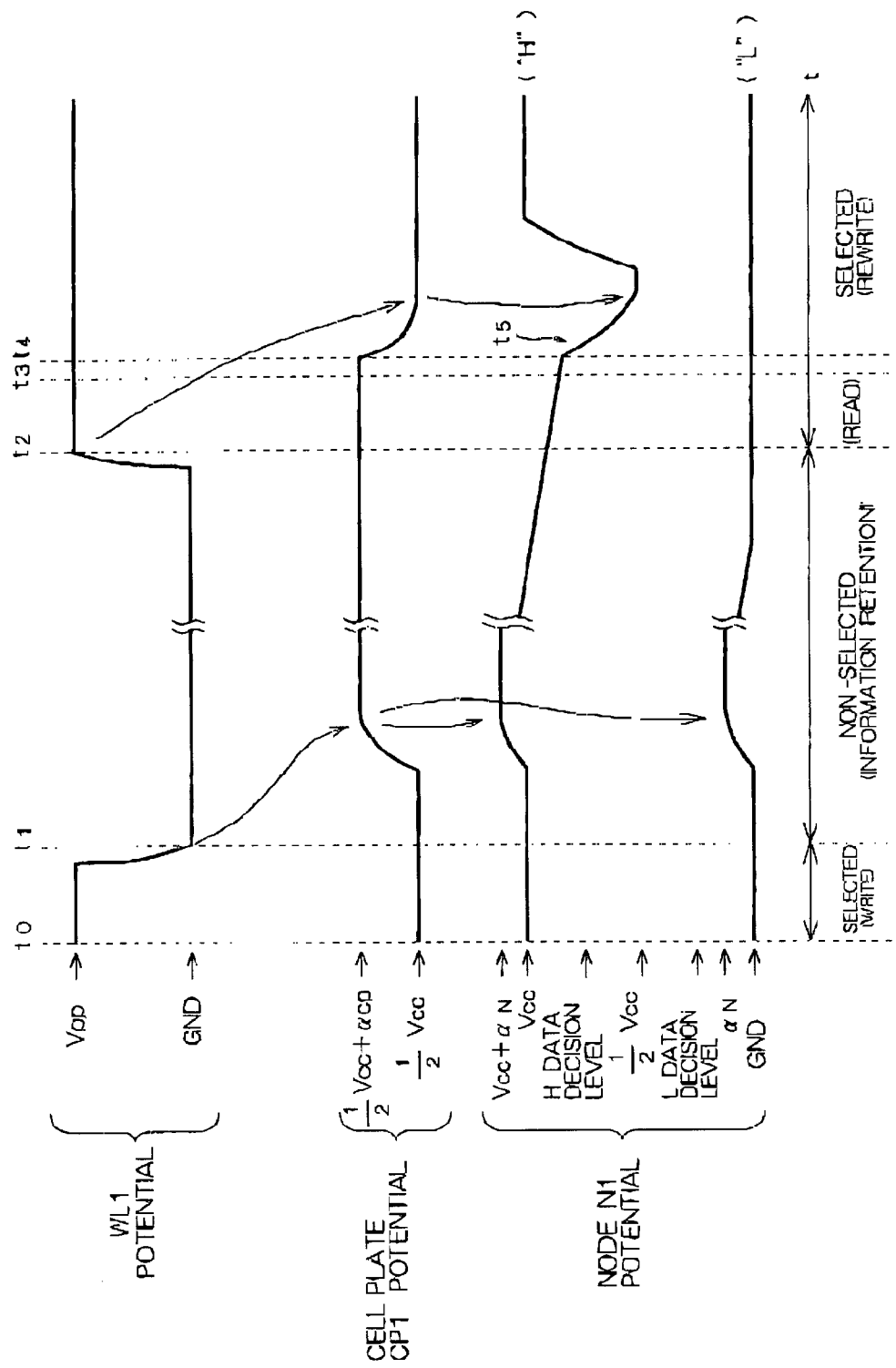
FIG. 2 is a timing chart showing an operation of a memory cell MC1.

Next, the operation of the semiconductor device 1000 is described for the case of the memory cell MC (memory cell MC1) located at the intersection of the word line WL1 and the bit line BL1 using FIGS. 1 and 2. FIG. 2 is a timing chart showing the operation of the memory cell MC1.

(Data Write Operation)

First, the data write operation is described. At time $t_0$, the word line WL1 is selected and the word lines WL2 to WLn are not selected by the word line decoder 400. Consequently, the potential of the word line WL1 is raised to Vpp. The potential of the word lines WL2 to WLn is the ground potential GND. Potential Vpp (5 V, for example) is greater than the power supply potential Vcc (3 V, for example). The reason is as follows. When writing data "H" to the memory cells MC, the potential of the nodes N is brought to Vcc. If the potential of the word line (gate electrode) at the time of raising is equal to the power supply potential Vcc, the potential of the nodes N does not become Vcc, and becomes a potential lower than Vcc by the threshold voltage of the access transistors nATr.

Since the potential of the word line WL1 is Vpp, the switch transistor nSTr1 in the cell-plate-potential-switching circuit 500 is turned on, and the switch transistor pSTr1 is turned off. The potential of the cell plates CP1 is therefore ($\frac{1}{2}$)Vcc.

When writing data "H" to the memory cell MC1, the potential of the node N1 is brought to Vcc by applying potential Vcc to the bit line BL1 by the read/write circuit 300 connected to the bit line BL1. When writing data "L" to the memory cell MC1, the potential of the node N1 is brought to GND by bringing the potential of the bit line BL1 to the ground potential GND by the read/write circuit 300 connected to the bit line BL1. In the write operation, the potential of the bit line XBL1 is an inversion of the potential of the bit line BL1.

Data is also written to the other memory cells selected by the word line WL1 through the bit lines BL2 to BLm. simultaneously in this write operation.

(Data Retention Operation)

Next, the data retention operation is described. The word line decoder 400 makes the word line WL1 non-select after the time $t_0$, and consequently the potential of the word line WL1 becomes the ground potential GND at time $t_1$. The access transistor nATr1 is thereby turned off, and the capacitor C1 retains the data.

Since the potential of the word line WL1 is GND, the switch transistor nSTr1 in the cell-plate-potential-switching circuit 500 turns off from on, and the switch transistor pSTr1 turns on from off. The potential of the cell plate CP1 therefore becomes ($\frac{1}{2}$)Vcc+αcp. As a result, when data "H" is retained in the capacitor C1, the potential of the node N1 is boosted to Vcc+$α_n$ by capacity coupling of the capacitor C1. On the other hand, when data "L" is retained in the capacitor C1, the potential of the node N1 is boosted to $α_n$. The potential Vcc+$α_n$ decreases to Vcc+$α_n$−ΔVsub(t) ≧GND, and the potential $α_n$ decreases to $α_n$ΔVsub(t) ≧GND as time passed, due to a subthreshold leak current. ΔVsub(t) is the potential decrease caused by the charge that is lost because or a subthreshold leak current, as time passed. The same decrease in potential occurs in other memory cells MC that is not selected.

(Data Read Operation)

Next, the data read operation is described. After the time $t_1$, half of the power supply potential, ($\frac{1}{2}$) Vcc, is applied to the bit lines (BL1 and XBL1), which is a precharging of the bit lines . The bit lines (BL1 and XBL1) are disconnected from the power supply and floated. The word line WL1 is then selected by the word line decoder 400, and hence the potential of the word line WL1 becomes Vpp at time $t_2$. The access transistor nATr1 is thereby turned on. When data "H" is written to the capacitor C1, the potential of the bit line BL1 becomes higher than ($\frac{1}{2}$)Vcc by a small value α. On the other hand, when data "L" is written to the capacitor C1, the potential of the bit line BL1 becomes lower than ($\frac{1}{2}$)Vcc by a small value α.

The potential of the bit line XBL1, ($\frac{1}{2}$)Vcc, and the potential of the bit line BL1 are compared and amplified by the sense amplifier 200 connected to these bit lines. When the data in the capacitor C1 is "H", the potential of the bit line BL1 becomes Vcc, and that of the bit line XBL1 becomes GND. When the data in the capacitor C1 is "L", on the other hand, the potential of the bit line BL1 becomes GND, and that of the bit line XBL1 becomes Vcc. Here the reading data from the memory cell MC1 is completed. Although the data stored in the capacitor C1 is once destroyed here, the data is rewritten according to the potential of the bit line BL1 when the data is read. Simultaneously in this reading operation, the data reading and rewriting operations are also performed on the other memory cells MC selected by the word line WL1 through the bit lines BL2 to BLm.

Major Effects of Semiconductor Device

The main effects of the semiconductor device 1000 of this embodiment are as follows:

(Effect 1)

Figure 3:
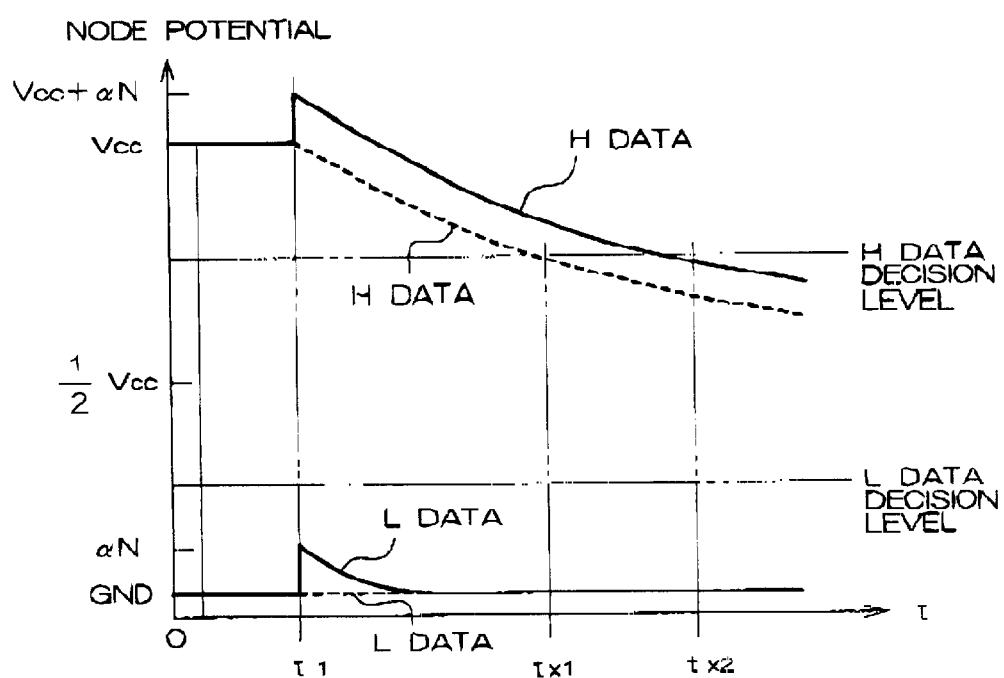
FIG. 3 is a graph showing a potential of a node during a non-selected period of a memory cell.
Figure 8:
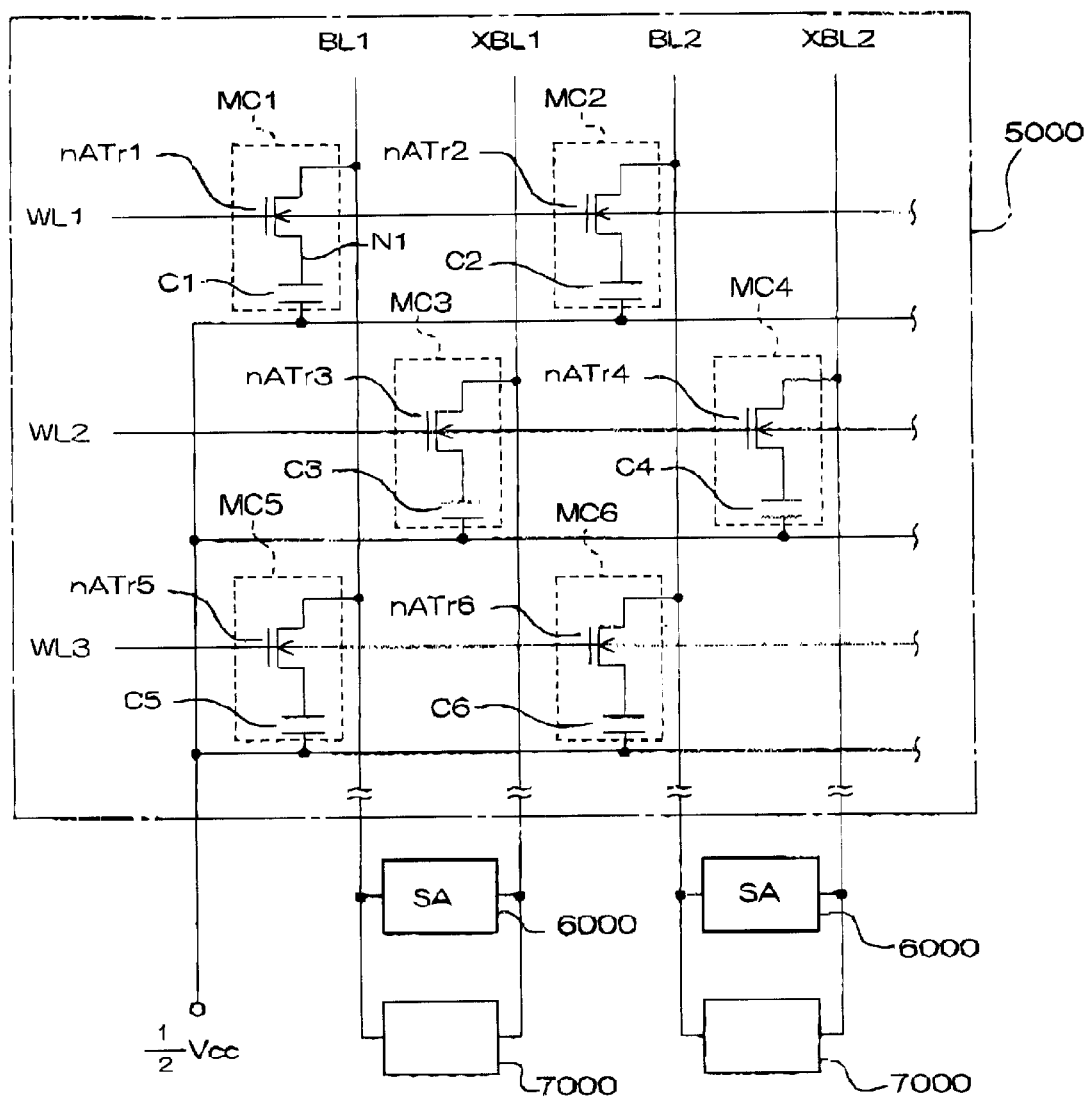
FIG. 8 is a circuit block diagram showing part of a conventional DRAM.

FIG. 3 is a graph showing the potential of the node during a non-selected period of a memory cell. The solid line shows the potential of the node N1 of the memory cell MC1 of this embodiment shown in FIG. 1. The dotted line shows the potential of the node N1 of the memory cell MC1 of the example of the conventional art shown in FIG. 8. The unit of time of the time axis in FIG. 3 is greater than that in FIG. 2. The potential of the node N1 of this embodiment therefore appears to rise at right angles.

Figure 4:
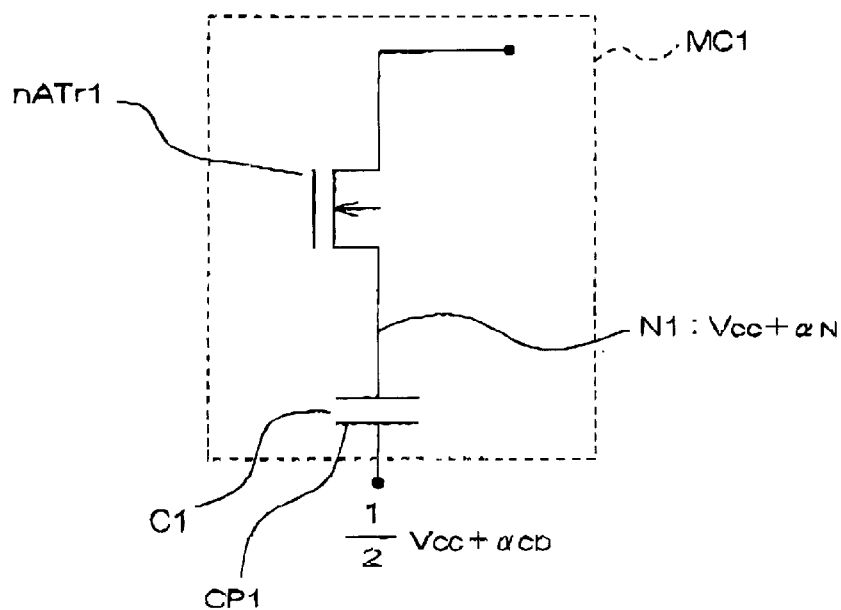
FIG. 4 is an equivalent circuit diagram of the memory cell MC1 when data "H" is retained in the capacitor C1 in the present embodiment.
Figure 5:
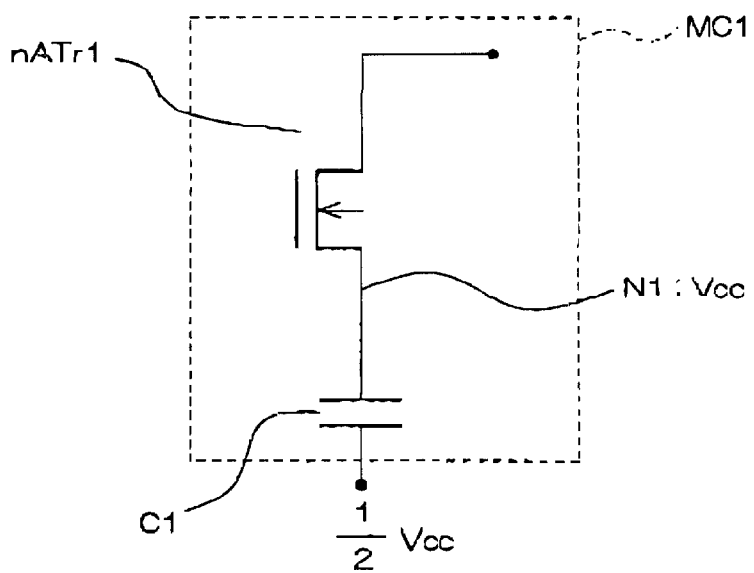
FIG. 5 is an equivalent circuit diagram of the memory cell MC1 when data "H" is retained in the capacitor C1 in a conventional semiconductor device.

At time $t_1$, the memory cell is not selected. The potential or the cell plate consequently changes from ($\frac{1}{2}$)Vcc to ($\frac{1}{2}$)Vcc+$\alpha$cp in this embodiment (FIG. 2.). Therefore, when the capacitor C1 is retaining data "H", the potential of the node N1 rises from Vcc to Vcc+$\alpha_n$. When the capacitor C1 is retaining data "L", the potential of the node N1 rises from GND to $\alpha_n$. Such a rise does not occur at the node N1 of the memory cell MC1 of the example of the conventional art shown in FIG. 8. FIG. 4 is an equivalent circuit diagram of the memory cell MC1 when data "H" is retained in the capacitor C1 in the present embodiment. FIG. 5 is an equivalent circuit diagram of the memory cell MC1 when data "H" is retained in the capacitor C1 in the example of the conventional art shown in FIG. 8.

Since the potential of the node N1 rises to Vcc+$\alpha_n$ in the case of data "H" in this embodiment as shown in FIG. 3, the time $t_{x2}$ at which the potential of the node N1 goes down below the H data decision level can be longer than in the example of the conventional art (time $t_{x2}$). Since the time at which the potential of the node becomes smaller than the H data decision level thus can be prolonged, the refreshing period can be prolonged. Consequently, the power consumption an be reduced. As the power consumption is reduced in the future, the threshold of the access transistors will become lower. In that case, the subthreshold leak current increases, reducing the refreshing period. This embodiment therefore will become effective.

Figure 9:
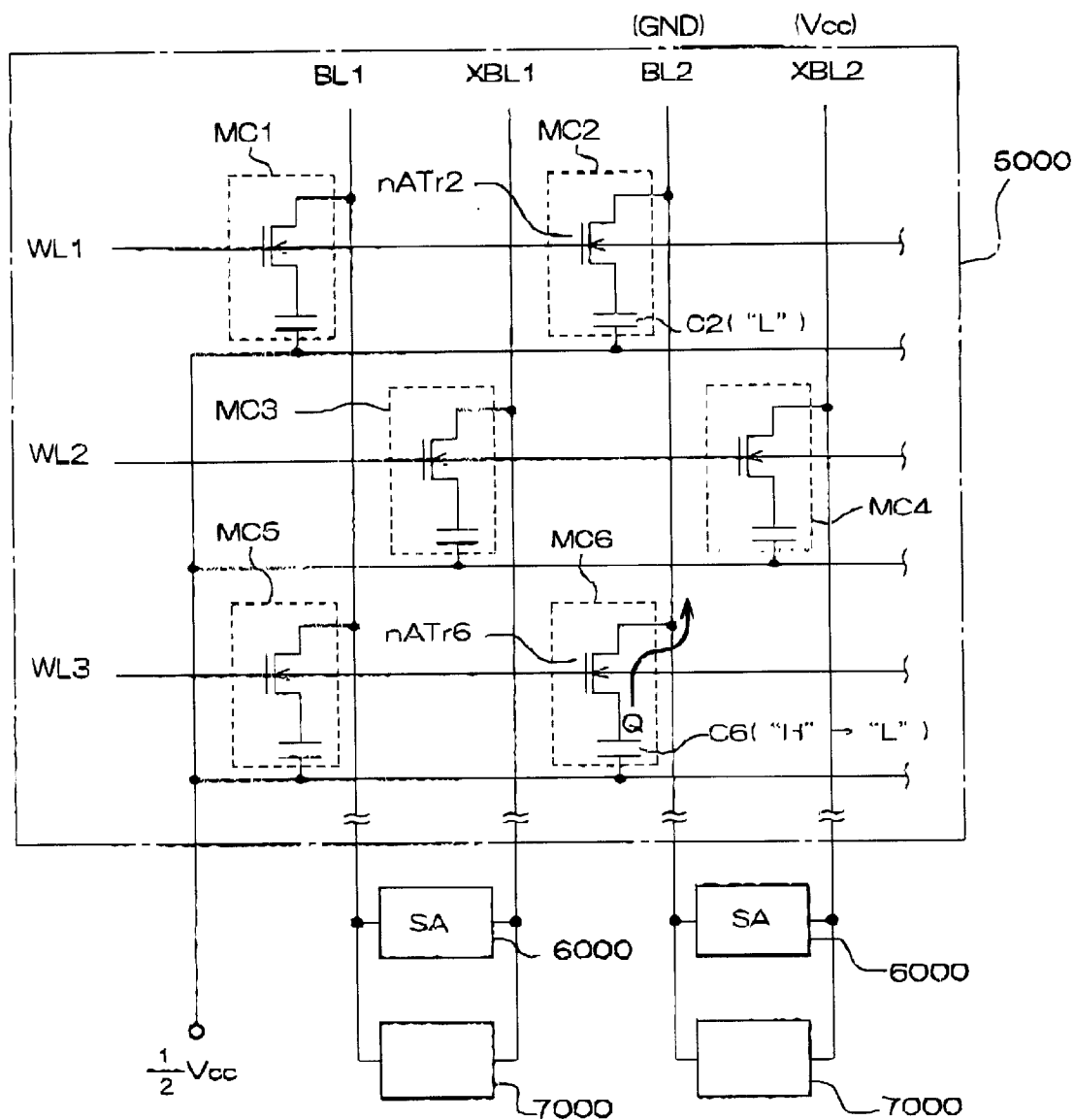
FIG. 9 is a circuit diagram of part of the conventional DRAM that illustrates a subthreshold leak current.

A subthreshold leak current can also occur for the following reason in addition to the case explained in the section of the background of the invention. If the word line WL2 is selected when data "H" is stored in the capacitor C6 as shown in FIG. 9, the potential of the word line WL3 located next to the word line WL2 rises very slightly from the ground potential GND. This can also cause a subthreshold leak current. Notwithstanding the occurrence of this, the refreshing period can be prolonged by this embodiment because of the above-described reason.

By using the voltage $\alpha_n$ of 0.5 V, for example, for the power supply potential Vcc of 3.0 V, for example, H data decision level of 2.0 V, for example, and L data decision level of 1.0 V, for example, the time $t_{x2}$ can be prolonged to 0.5 second, for example. Under the same conditions, the time $t_{x1}$ is 0.1 second, for example. The refreshing period therefore can be prolonged by increasing the voltage $\alpha_N$. The voltage $\alpha_N$ can be adjusted by adjusting the voltage $\alpha$cp. The voltage $\alpha_N$ can be increased by increasing the voltage $\alpha$cp. The voltage $\alpha_N$ can be set up to the L data decision level.

(Effect 2)

To prevent data "H" from being read as data "L" wrongly, the following method is used in this embodiment. This will be described referring to FIGS. 1 and 2. When the potential of the word line WL1 changes from GND to Vpp at time $t_2$, the switch transistor nSTr1 of the cell-plate-potential-switching circuit 500 turns on from off, and the switch transistor pSTr1 turns off from on. The potential of the cell plate CP1 consequently changes from Vcc+$\alpha$cp to ($\frac{1}{2}$)Vcc. Therefore, when data "H" is retained in the capacitor C1, the potential of the node N1 quickly decreases. Because of this, the potential of the node N1 can become lower than the H data decision level. Data "H" in the capacitor C1 is read as "L" in this manner.

In this embodiment, the time $t_4$ at which the potential of the cell plate CP1 starts dropping is delayed until after the time $t_2$ at which the potential of the word line WL1 changes from GND to Vpp. The sense amplifier 200 latches the data from the capacitor C1 no later than time $t_5$ in this period. Since latching can be completed before the potential of the node N1 quickly drops, data "H" can be read for certainty.

However, the sense amplifier still can read data "H" even if the end of latching is after the time $t_{A\ F}$ provided the potential of the node N1 is higher than the "H" decision level In this embodiment, therefore, data "H" can be read till time $t_5$.

To delay the time $t_4$ after the time $t_2$, there are the following two methods, for example. One is to make the current supply capability of the switch transistors nSTr smaller than that of the word line decoder 400. The other is to make the capacitance of each word line WL (word line WL1, for example) smaller than that of the cell plates (cell plates CP1, for example) of the memory cell group corresponding to the word line WL.

(Effect 3)

The cell plates of the memory cell array 100 are divided into the cell plates CP1 to CPn as shown in FIG. 1. The potential of the cell plates is switched for each cell plate CP1 to CPn by controlling the potential of the word lines WL1 to WLn. Therefore, the potential switching speed of the cell plates CP1 to CPn can be synchronized with the speed of switching the word lines WL1 to WLn. In other words, the reading period (a period from time $t_2$ to time $t_3$ in FIG. 2) for the memory cells MC connected to a word line WL can be set as easily as the reading period for the memory cells connected to other word lines WL.

Further, since the capacitance of the cell plates of which the potential is switched is decreased, the power consumption can be reduced.

Example of applying the semiconductor device to an electronic device

Figure 6:
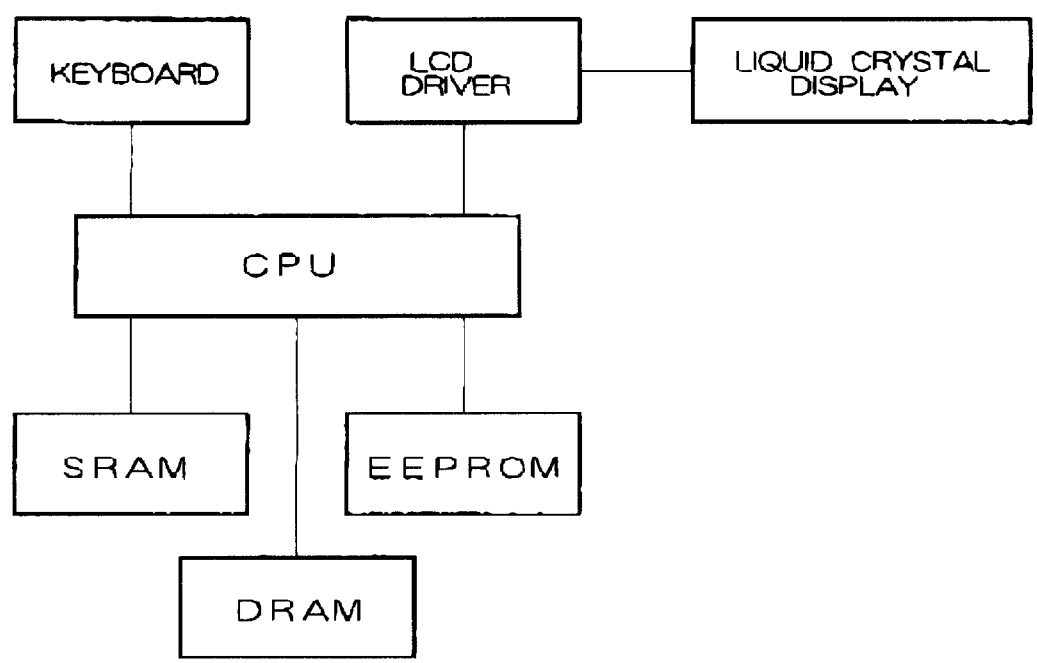
FIG. 6 is a block diagram of part of a system of cellular phone.

The semiconductor device 1000 can be applied to electronic devices such as cellular phones FIG. 6 is a block diagram of part of a system or cellular phone. A SRAM, DRAM, EEPROM, keyboard, and LCD driver are connected to a CPU via bus lines. The LCD driver is connected to a liquid crystal display section via a bus line. The DRAM in FIG. 6 is the semiconductor device 1000.

Figure 7:
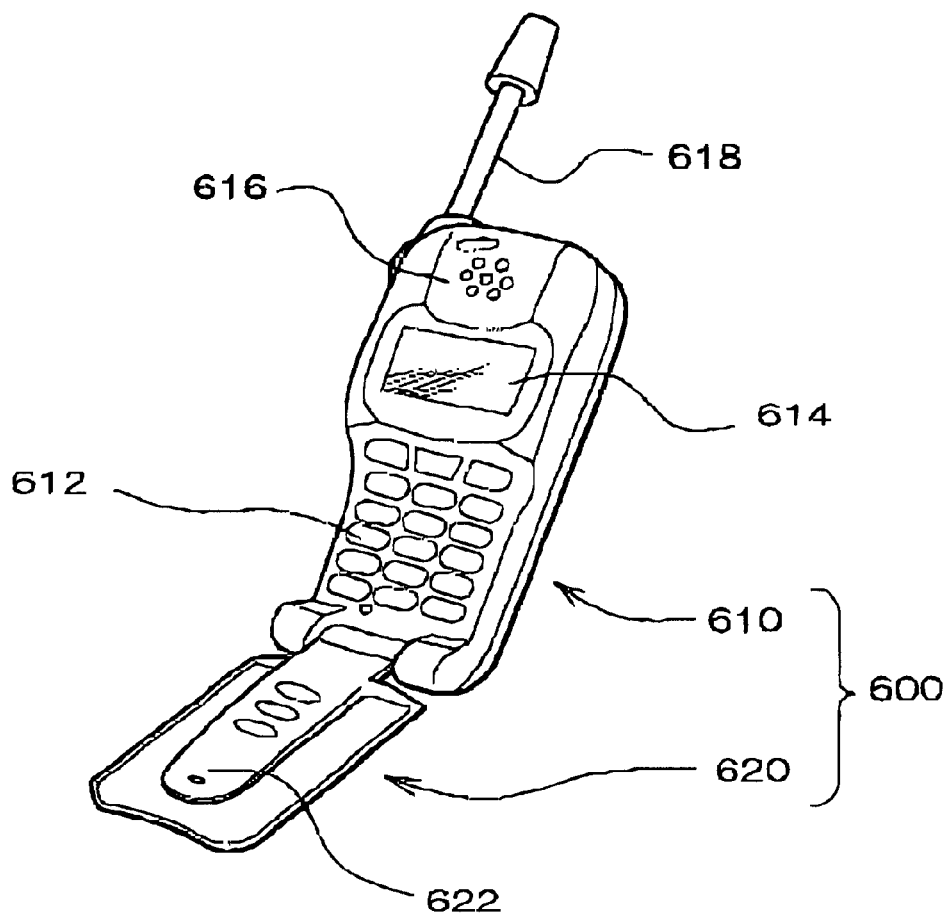
FIG. 7 is a perspective view of a cellular phone having the system of the cellular phone shown in FIG. 6.

FIG. 7 is a perspective view of a cellular phone 600 having the system of cellular phone shown in FIG. 6. The cellular phone 600 has a keyboard 612, liquid crystal display section 614, main body 610 containing a receiver section 616 and antenna 610, and cover 620 containing a transmitter section 622.

What is claimed is:

1. A semiconductor device having a memory cell array comprising a plurality of memory cells and a plurality of word lines and in which the selection and non-selection of the memory cells is controlled by changing a potential of the word lines, wherein:

each of the memory cells comprises an n-type access transistor and a capacitor having a cell plate;

predetermined potential is applied to the cell plate, a potential of the cell plate during a period when the memory cells are selected is a first potential;

a potential of the cell plate during a period when the memory cells are non-selected is a second potential larger than the first potential; and a switching of the potential of the cell plates is controlled by changing a potential of the word lines.

2. The semiconductor device according to claim 1, comprising a plurality of memory cell groups each of which includes a plurality of the memory cells, wherein:

the n-type access transistor included in one of the memory cell groups is controlled by one of the word lines;

the cell plates at the n-type access transistors included in each of the memory cell groups are connected together; and the cell plates of one of the memory cell groups are separated from the other cell plates in a rest of the memory cell groups.

3. The semiconductor device according to claim 2, comprising a sense amplifier for amplifying data from the capacitor, wherein a time at which the cell plate is switched from the second potential to the first potential is delayed until after a time at which the word lines start selection of the memory cells; and wherein the sense amplifier latches the data from the capacitor before a time at which the cell plate is switched to the fist potential.

4. The semiconductor device according to claim 3, wherein a capacitance of each of the word lines is smaller than a capacitance of the cell plate of one of the memory cell groups corresponding to each of the word lines.

5. The semiconductor device according to claim 3, including at least one of DRAM (Dynamic RAM), PSRAM (Pseudo Static RAM), and VSRAM (Virtually Static RAM).

6. The semiconductor device according to claim 2, wherein a potential of the cell plate is switched for each of the memory cell groups.

7. The semiconductor device according to claim 6, comprising a cell-plate-potential-switching circuit that includes the word lines, a plurality of n-type switch transistors and a plurality of p-type switch transistors, wherein, in one of the word lines, and one of the n-type switch transistors and one of the p-type switch transistors provided to the one of the word lines, the one word line is connected to a gate electrode of the one n-type switch transistor and a gate electrode of the one p-type switch transistor;

one of sources/drains of the one n-type switch transistor is connected to the cell plate provided to one of the memory cell groups corresponding to the one word line;

the first potential is applied to another one of the sources/drains of the one n-type switch transistor;

one of sources/drains of the one p-type switch transistor is connected to the cell plate provided to one of the memory cell groups corresponding to the one word line; and the second potential is applied to another one of the sources/drains of the one p-type switch transistor.

8. The semiconductor device according to claim 6, comprising a sense amplifier for amplifying data from the capacitor, wherein a time at which the cell plate is switched from the second potential to the first potential is delayed until after a time at which the word line start selection of the memory cells; and wherein the sense amplifier latches the data from the capacitor before a time at which the cell plate is switched to the fist potential.

9. The semiconductor device according to claim 8, comprising a word line decoder, wherein a current supply capability of the n-type switch transistor is smaller than a current supply capability of the word line decoder.

10. The semiconductor device according to claim 9, wherein a capacitance of each of the word lines is smaller than a capacitance of the cell plate of one of the memory cell groups corresponding to each of the word lines.

11. The semiconductor device according to claim 8, wherein a capacitance of each of the word lines is smaller than a capacitance of the cell plate of one of the memory cell groups corresponding to each of the word lines.

12. The semiconductor device according to claim 8, including at least one of DRAM (Dynamic RAM), PSRAM (Pseudo Static RAM), and VSRAM (Virtually Static RAM).

13. The semiconductor device according to claim 1, comprising a sense amplifier for amplifying data from the capacitor, wherein a time at which the cell plate is switched from the second potential to the first potential is delayed until after a time at which the word lines start selection of the memory cells; and wherein the sense amplifier latches the data from the capacitor before a time at which the cell plate is switched to the fist potential.

14. The semiconductor device according to claim 13, including at least one of DRAM (Dynamic RAM), PSRAM (Psendo Static RAM), and VSRAM (Virtually Static RAM).

15. The semiconductor device according to claim 1, wherein the cell plate of all of the memory cells is connected together.

16. The semiconductor device according to claim 1, wherein write and/or rewrite is performed when the potential of the cell plate is the first potential during the period when the memory cells is selected.

17. The semiconductor device according to claim 1, wherein the first potential is one half a power supply potential Vcc.

18. The semiconductor device according to claim 1, including at least one of DRAM (Dynamic RAM), PSRAM (Pseudo Static RAM), and VSRAM (Virtually Static RAM).

19. An electronic device comprising the semiconductor device as defined in claim 18.

20. An electronic device comprising the semiconductor device as defined in claim 1.

* * * * *